United States Patent [19]

Hotchkiss

[11] Patent Number: 5,028,546

[45] Date of Patent: Jul. 2, 1991

[54] METHOD FOR MANUFACTURE OF SOLAR CELL WITH FOIL CONTACT POINT

[75] Inventor: Gregory B. Hotchkiss, Dallas, Tex.

[73] Assignee: Texas Instruments Incorporated, Dallas, Tex.

[21] Appl. No.: 388,280

[22] Filed: Jul. 31, 1989

[51] Int. Cl.⁵ .......................................... H01L 31/18
[52] U.S. Cl. ........................................ 437/2; 136/250
[58] Field of Search ................. 136/250; 437/2-5, 437/197, 199, 202-205, 209, 221-222

[56] References Cited

U.S. PATENT DOCUMENTS

| | | | |
|---|---|---|---|
| 3,040,416 | 6/1962 | Matlow et al. | 437/2 |
| 3,350,775 | 11/1967 | Iles | 437/2 |
| 4,407,320 | 10/1983 | Levine | 136/250 |
| 4,425,408 | 1/1984 | Levine et al. | 428/403 |
| 4,430,150 | 2/1984 | Levine et al. | 156/616 |
| 4,451,968 | 6/1984 | Jensen et al. | 29/572 |
| 4,521,640 | 6/1985 | Levine | 136/250 |
| 4,581,103 | 4/1986 | Levine et al. | 156/659 |
| 4,582,588 | 4/1986 | Jensen et al. | 204/37.6 |
| 4,637,855 | 1/1987 | Witter et al. | 156/616 |
| 4,691,076 | 9/1987 | Levine et al. | 136/250 |
| 4,806,495 | 2/1989 | Levine et al. | 437/2 |

Primary Examiner—Aaron Weisstuch
Attorney, Agent, or Firm—James C. Kesterson; James T. Comfort; Melvin Sharp

[57] ABSTRACT

Solar cells formed of semiconductor discrete spheres of P-type interior having an N-type skin are disclosed. The semiconductor spheres are pressed between a pair of aluminum foil members. A plurality of metal pads are formed to the P-type material of the discrete spheres to provide electrical contacts. The aluminum foils are flexible and electrically insulated from one another. One of the foils is electrically connected to the N-type skin of the discrete semiconductor sphere, and the other is electrically connected to the P-type interior of the sphere by means of the metal pads. The cells are patterned in a foil matrix forming an array. Multiple arrays can be interconnected to form a module of solar cell elements for converting sun light into electricity.

16 Claims, 4 Drawing Sheets

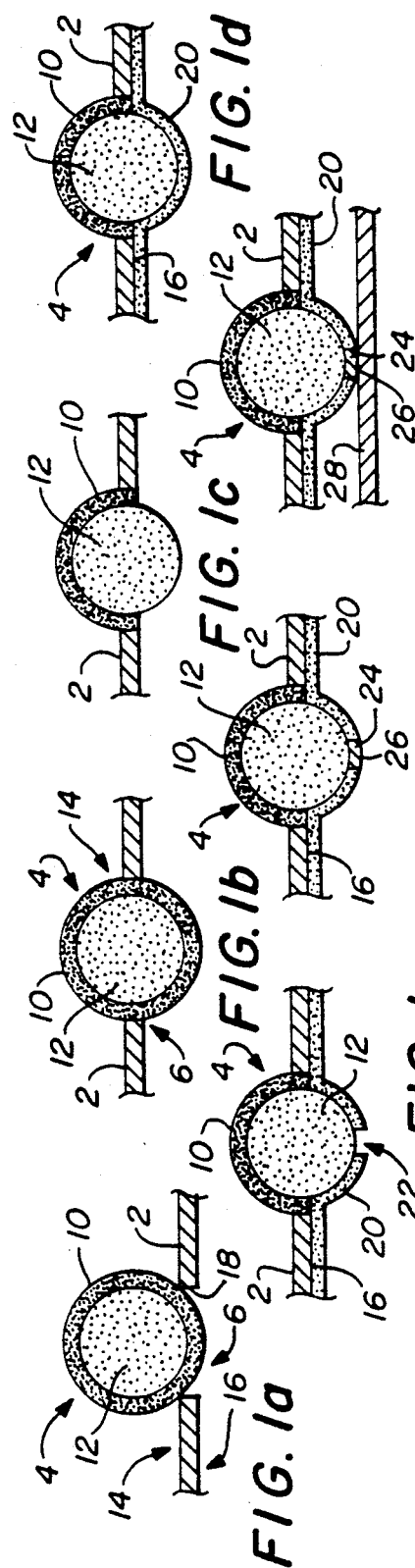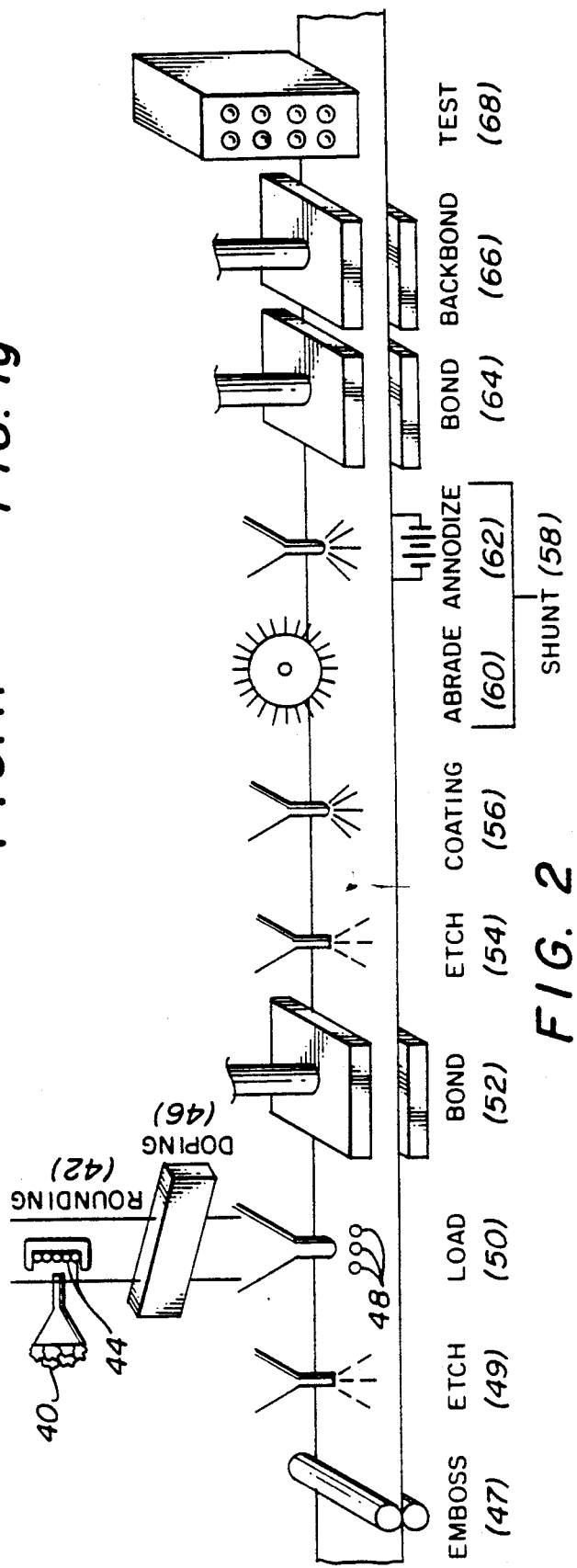

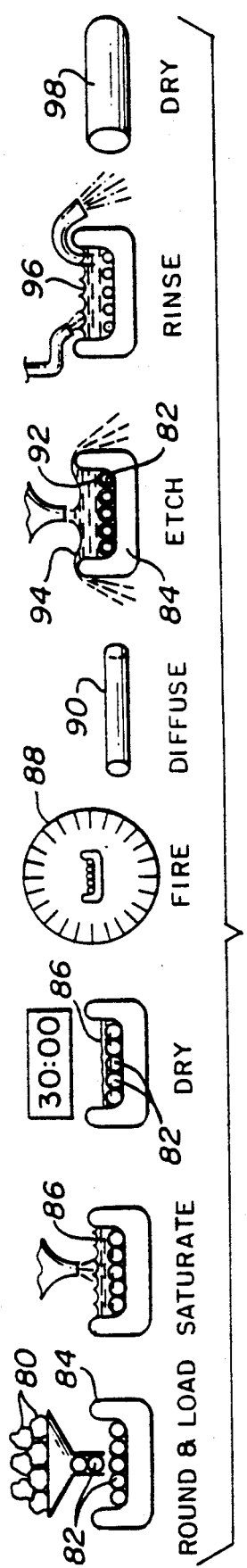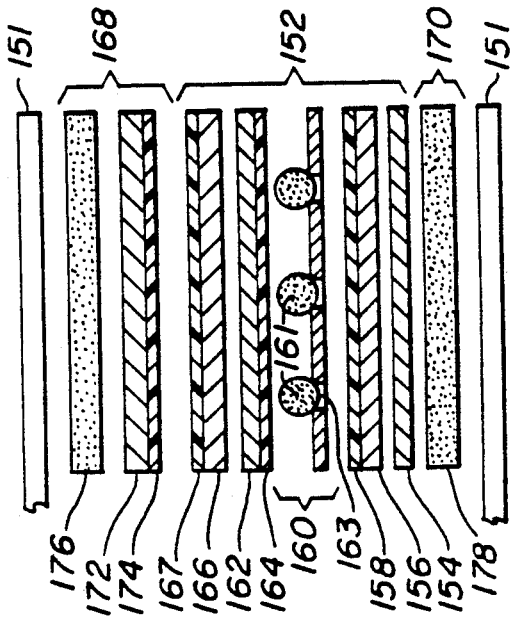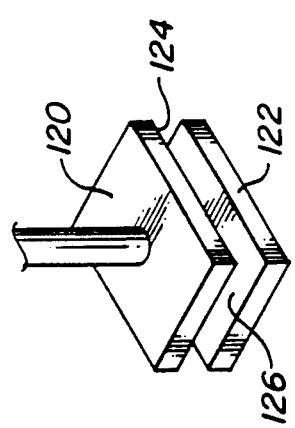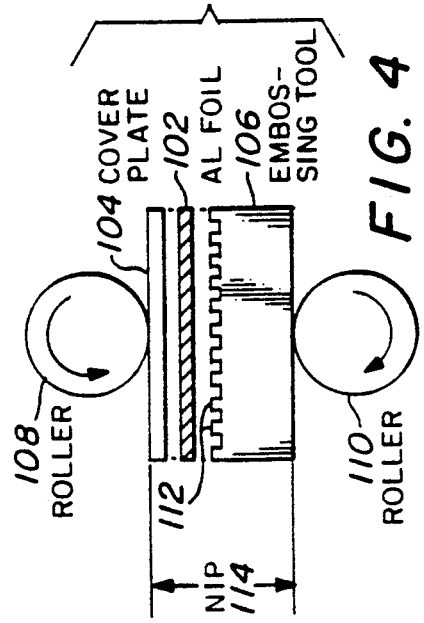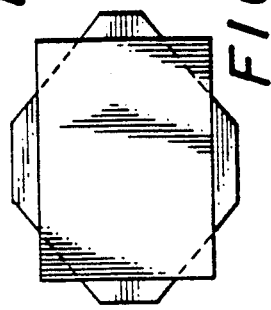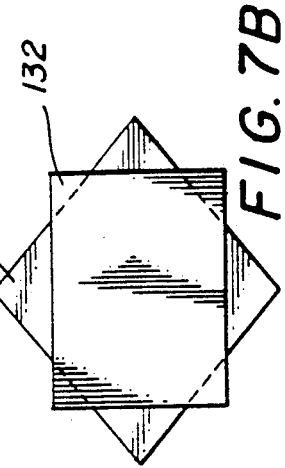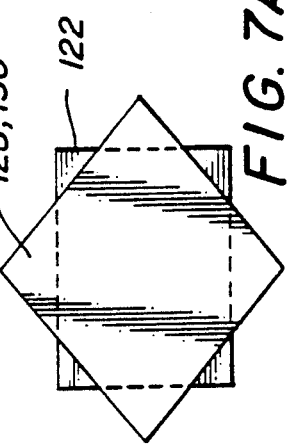

NOTE:
N₂ TANK IN LINE WITH ACTUATOR INCREASES OPENING SPEED OF VALVE

METHOD FOR MANUFACTURE OF SOLAR CELL WITH FOIL CONTACT POINT

RELATED APPLICATIONS

"METHOD OF MAKING DOPED SILICON SPHERES", by G. B. Hotckiss et al., filed July 31, 1989, Ser. No. 387,677;

"METHOD AND APPARATUS FOR CONSTRUCTING A FOIL MATRIX FOR A SOLAR CELL", by M. J. Jensen et al., filed July 31, 1989, Ser. No. 387,250;

"METHOD OF AFFIXING SILICON SPHERES TO A FOIL MATRIX", by G. B. Hotchkiss, filed July 31, 1989, Ser. No. 388,105;

"METHOD OF ISOLATING SHORTED SILICON SPHERES", by S. G. Parker et al., filed July 31, 1989, Ser. No. 387,244; and "METHOD FOR APPLYING AN ORGANIC INSULATOR TO A SOLAR ARRAY" by M. D. Hammerbacher, filed July 31, 1989, Ser. No. 387,929.

TECHNICAL FIELD OF THE INVENTION

This invention relates generally to solar arrays and more particularly to a solar cell having a foil contact point and a method for its manufacture.

BACKGROUND OF THE INVENTION

A number of systems for converting sunlight to electricity are known. One such system that has proven useful in efficiently producing electricity from the sun's radiation is described in U.S. Pat. No. 4,691,076. In that system, an array is formed of semi-conductor spheres. Each sphere has a P-type interior and an N-type skin. A plurality of the spheres are housed in a pair of aluminum foil members which form the contacts to the P-type and N-type regions. The foils are electrically insulated from one another and are flexible. Multiple arrays can be interconnected to form a module of solar cell elements for converting sunlight into electricity.

In order to produce sufficient quantities of the arrays, it is necessary to have a process for their manufacture that is uncomplicated, low cost and efficient. An uncomplicated system would be one using currently available technology constructed in such a way that the applicable process steps can be conducted in a highly repeatable manner. Moreover, the less complicated the process steps, generally the more cost effective will the entire process be carried out. Finally, the more repeatable the process, the more efficiently the operation and the higher production of solar arrays.

A key process step in the making of silicon solar cells is forming good ohmic contact between the P-type region of the silicon sphere and the foil forming the back bond. The only known technique for bonding the backfoil to the silicon spheres is to apply an insulating coat, then remove a portion of the coat from the sphere tips and apply the backfoil directly to the spheres. This technique was labor intensive and very dependent upon the individual operator. Another problem with the technique was that it was difficult to obtain good ohmic contact between the silicon sphere and the backfoil when the back foil is bonded at temperatures in the range of 300° C. to 350° C. Still another difficulty with the technique was that it did not lend itself to methods of mass production.

SUMMARY OF THE INVENTION

In accordance with the present invention, there is provided a method of producing a solar array having the noted advantages in that products are efficiently produced using an uncomplicated and low cost process.

In one embodiment of the invention, a solar array is provided. The solar array comprises a first foil having a plurality of spaced apertures therein. A plurality of discrete semiconductor members are disposed and fixed in corresponding ones of said apertures. Each of said semiconductor members has a P-type and N-type region. A plurality of foil pads or aluminum dots are provided where each of said pads is affixed to the P-type region of a corresponding one of the semiconductor members fixed in the corresponding aperture. A second foil, or backfoil, contacts each of said foil pads while otherwise being electrically insulated from the first foil.

A technical advantage of this invention is that the foil pad provides a relatively clean, easily applied and oxide-free surface for bonding of the backfoil to the spheres. Another technical advantage of the invention is that the aluminum dots supply a good ohmic contact to each sphere. Still another technical advantage is that the aluminum dots tend to repel polyimide-type plastics and to prevent their adhesion.

In another embodiment, a method is provided for affixing a foil pad to each of a plurality of silicon spheres mounted in a foil matrix. In the first step, a cell sandwich is formed comprised of an upper pad, the foil matrix with the mounted silicon spheres, a foil and a plate. In the next step, the cell sandwich is compressed to a first pressure. Next, the pressurized cell sandwich is heated to a predetermined temperature. In the next step, the heated cell sandwich is compressed to a second pressure greater than the first pressure for a period of time sufficient to fuse the foil to the silicon sphere. Finally, the excess foil is removed leaving a foil pad affixed to each of the silicon spheres.

DESCRIPTION OF THE DRAWINGS

FIG. 1 is a schematic diagram of a solar cell after each of the processing steps utilized in accordance with the present invention;

FIG. 2 is a process schematic diagram of the process utilized in forming a solar array in accordance with the present invention;

FIG. 3 is a process schematic diagram of the process for producing doped silicon spheres in accordance with the present invention;

FIG. 4 is an apparatus for embossing aluminum foil in accordance with the present invention;

FIG. 5 is an apparatus for use in accordance with the present invention for loading silicon spheres and constructing aluminum foil cell packages;

FIG. 6 illustrates the cell package layers used in accord with the present invention;

FIGS. 7A–7C are a set of diagrams illustrating various foil layout patterns for use with the front bonding process;

DESCRIPTION OF THE PREFERRED EMBODIMENT

Figure 8:
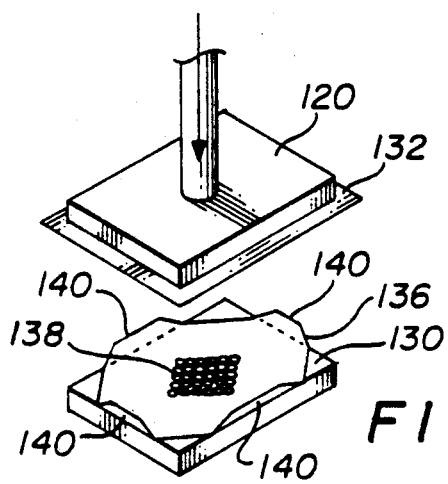
FIG. 8 illustrates the positioning of pressure pads in the loading station of the present invention.

Referring now to FIG. 1, there is shown a solar cell resulting from the various processing steps utilizing the features of the present invention.

Initially as shown in FIG. 1(a), a flexible aluminum foil 2, with from 0.5% to 1.5% but preferrably 1.0% about two mil thickness is provided. Foil 2 has a very thin oxide layer on its surface due to normal exposure to the environment. While the description herein will be with respect to a single solar array member or cell, it should be understood that a multiplicity of array members is provided in the total array as is exemplified. by the prior art noted herein above.

The aluminum foil 2 is initially embossed in a periodic hexagonal arrangement, on sixteen mil centers. The diameter of the embossed region is slightly smaller than the diameter of the doped spheres 4 to be disposed therein. The embossments can be circular or of any other geometrical shapes such as hexagonal or octagonal. In the case of polygonal shape of the embossment, a line across the polygon through its center will be less than the diameters of the spheres to be applied thereto. The foil 2 is then cleaned to remove organics and then etched with heated sodium or potassium hydroxide to remove the region of the foil where the embossing is made to provide an aperture 6 in its place. The etched foil comprised of a plurality of apertures 6 is referred to as an aluminum matrix.

At this point the foil can optionally be textured by etching with a fifty percent solution of 39A etchant which is twenty-five percent HF, sixty percent $HNO_3$ and fifteen percent glacial acetic acid to provide a matrix surface that minimizes back reflections.

The doped silicon spheres 4 are deposited over the frontside 14 of the matrix on foil 2 and vacuum is provided on the backside 16 of the foil with a vacuum chuck to draw the spheres 4 into the apertures 6. Because an excess of spheres 4, relative to the number of apertures 6, is initially utilized on the foil frontside 14, all of the apertures 6 will be filled with the spheres 4 and the excess spheres 4 are then removed by known techniques.

The spheres utilized are preferably 14.5 mils in diameter and the apertures 6 as explained above, have a cross-sectional diameter of something less than 14.5 mils to provide a vacuum with the foil at the foil front 18 for reasons to be made clear hereinafter. The spheres 4 are then bonded with the aluminum foil 2 within the apertures 6 as shown in (b).

Referring to FIG. 1(b), the sphere 4 is disposed in the aperture 6 so that the equator thereof is forward of the aluminum foil 2 or on the front side 14 thereof. This arrangement is made possible by the use of pressure pads which are disposed above and below the aluminum foil 2. Pressure pads are formed of aluminum foil from about 1 mil to about 8 mils thick and coated with a release agent, such as boron nitride powder, which acts as a cushion so that the press does not injure the spheres 4 during compression.

The rear surface 16 of the foil 2 and the portion of sphere 4 on the rear side surface is then etched using any of planar, $HF/HNO_3$/urea or 39A etchant (approximately fifteen percent glacial acetic acid, twenty-five percent HF and sixty percent $HNO_3$). As shown in FIG. 1(c), the N-type layer 10 on the back surface of sphere 8 is removed, exposing the P-type region 12. The aluminum foil 2, with the native oxide thereon, acts as a mask to the etchant permitting only the portion of the layer 10 to the rear side of the array to be removed. The array is then rinsed with the deionized water to remove the etchant. As shown in FIG. 1(d), a polyimide coating 20 such as Kapton ® available from DuPont is administered to the backside 16 of foil 2.

In FIG. 1(e), polyimide coating 20 on backside 16 is abraded to remove a small region 22 of polyimide coating 20 to expose a portion of the P-type material 12 of sphere 4.

In the next step, the array undergoes an anodizing process to isolate shorted cells. In the process, the array is immersed in a diluted HF bath with a potential difference of approximately 0.5 volts between the anode and cathode. The anodization process takes approximately thirty seconds providing a sufficient insulating coating between P-region 12 of sphere 8 thus isolating a sphere 8 that is shorted to foil 2.

In FIG. 1(f), an aluminum pad 24 is affixed to the P-region 12 through region 22 of sphere 8 to form an electrical connection 26.

In FIG. 1(g) a thin aluminum foil 28 of about 0.5 mil thickness is then positioned over the aluminum pad 4 of each of the spheres 8 so that it will contact the aluminum pad 24 at electrical connection 26. The aluminum is heated to a temperature of about 400° C. preferably, and in the range of about 350° to 450° C. The heated foil is then pressed against the array by means of a compression press such as that described hereinafter forming a contact between the aluminum pad 24 and the foil 28.

Referring now to FIG. 2, a process for constructing the solar cell shown in FIG. 1 is described. Initially, raw silicon oxide 40 is processed, using known techniques, at rounding station 42 to produce silicon spheres 44. Techniques for rounding the silicon spheres are shown in U.S. Pat. Nos. 4,425,408, 4,637,855, and co-pending application Ser. No. 188,184, assigned to the Assignee of the present application. The silicon spheres 44 are subjected to a doping process at doping station 46 to produce doped silicon spheres 48 having an N-type skin and a P-type interior.

The doped silicon spheres 48 are then loaded on the apertured aluminum foil at load station 50. Prior to loading the doped silicon spheres 48 at load station 50, the raw aluminum foil is embossed with the matrix pattern at emboss station 47 and the apertures etched into the foil at etch station 49. The foil with the loaded silicon spheres 48 is moved to bond station 52 where a compression bonding technique described hereinafter is used to bond the doped silicon spheres 48 to the aluminum foil as depicted in FIG. 1(b).

At etch station 54 the P-type region of silicon sphere 48 is etched on the backside of the solar array to expose the P-region of the sphere as shown in FIG. 1(c). In the next step, a polyimide is applied at coating station 56 to provide an insulating layer as depicted in FIG. 1(d).

At shunt station 58, a portion of the polyimide coating is removed to provide a region for fixing the aluminum pads as described hereinafter. After abrading and removing the polyimide at etch station 60, the array is subjected to an anodizing process at anodize station 62 to isolate those spheres that have a P-region shorted to the aluminum foil or otherwise forming a uninsulated contact. After the shorted spheres are shunted at shunt station 58, the aluminum pads are affixed at bond station 64. After the aluminum pad are affixed at bond station 64, the aluminum foil backing is applied at backbond station 66 forming a complete solar cell such as that depicted in FIG. 1(g). The completed solar cell is conveyed to test station 68 where various tests, as is well known to those skilled in the art, are performed.

Referring now to FIG. 3, the method for preparing the doped silicon spheres is described. Raw silicon oxide 80 is processed using known techniques to form silicon spheres 82. The silicon spheres are loaded in a quartz boat 84 which is filled with liquid dopant taken from either Group III or Group V of the Periodic Table of Elements. In the preferred embodiment, P854 phosphorus dopant available from Diffusion Technologies of Milpitas, Calif., is used. The excess liquid dopant 86 is drawn from quartz boat 84 so that the spheres 82 are barely covered by the liquid. The saturated silicon spheres are allowed to air dry for between 20 and 90 minutes, preferably 30 minutes, and then heated in an oven 88 at a temperature in the range between 100° C. and 200° C. for between 15 and 60 minutes, preferably 150° C. for 30 minutes. After heating, the saturated silicon spheres are taken to a quartz diffusion tube 90 and heated in a controlled atmosphere such as a nitrogen atmosphere at a temperature in the range of 850° C. to 1200° C. for approximately one hour. After the diffusion step, a thin film of phosphorus glass 92 is formed on the outside of the silicon spheres. That phosphorus glass is removed using a rinse 94 comprised of at least a ten percent concentration of HF. After etching off the excess phosphorus glass 92, the silicon spheres 82 are rinsed in deionized water 96 for thirty minutes. In the next step, the silicon spheres are spun dry in dryer 98 for between 200 and 800 seconds to remove excess moisture. The spheres are then resaturated and the process repeated once again to provide adequate penetration of dopant into the raw silicon oxide. The range of penetration is between 1.00 microns and 1.50 microns with 1.25 microns appearing to be optimally obtained after two passes through the process.

Referring now to FIG. 4, a book rolling apparatus 100 for embossing the aluminum foil to produce apertures for accepting the silicon spheres is described. A thin sheet of aluminum foil 102 of between 2.0 and 3.0 mils thickness is sandwiched between a flexible cover plate 104 and an embossing tool 106. The sandwich 107 is fed between two rotating rollers 108 and 110 which create a series of depressions or regions of lesser thickness in the aluminum foil.

The flexible cover plate 104 is constructed of spring steel with a thickness substantially greater than the thickness of aluminum foil 102, about 0.1875 inches thick. Cover plate 104 is chamfered at the edges to minimize the contact angle with the top roller. Embossing tool 106 is constructed of hardened steel, tungsten carbide or other hardened material ($R_c \geq 60$) with outside dimensions of 3.0"×3.5"×0.5" thick. It must be built to very strict tolerances and each post must be square to the top face 113. In the preferred embodiment, embossing tool 106 is constructed using electron discharge machining. The posts 112, which do the actual penetration into the foil, number about 5100 and can be either round or polygonal but must have very smooth faces 116. Each post 112 has selected dimensions so as to produce a region of lesser thickness in foil 102 that when etched away will produce an aperture with a diameter less than the silicon spheres. The layout or pattern of posts 112 is selected to maximize the number of post per area. Posts 112 are centered with respect to the edges of embossing tool 106 and are contained within a square having side dimensions of 1.25 inches. The aluminum foil 102 is doped with 1% silicon by weight.

Rollers 108 and 110 are separated from one another forming a nip 114 having a dimension that is less than the thickness of cover plate 104, foil 102 and embossing tool 106. In the preferred embodiment, sandwich 107 is passed through roller 108 and 110 twice in order to obtain sufficient penetration of posts 112 into foil 102. Each pass requires about two seconds to feed sandwich 107 completely through rollers 108 and 110. Sandwich 107 can be fed to rollers 108 and 110 by suitable feeding means, such as a conveyor belt (not shown but well known to those skilled in the art).

In the preferred embodiment, nip 114 is selected to provide an approximate average pressure in the range of 16000 lbf to 20000 lbf with approximately 18000 lbf being optimum.

In practice, the roller 108 makes point contact with posts 112 distributing the above mentioned pressure across several rows. In the preferred embodiment, roller 108 would span only one row of posts 112 thus maximizing the pressure. It is recognized that the above described pressures will vary according to the conditions of the embossing. For example, a wider embossing tool for larger sized cells will require more force to maintain the same pressure and should scale as the ratios of widths. A larger diameter roller would also require proportionally more force.

After the embossing is complete and the foil has regions of lesser thickness thereon it is etched at 60° C. with 45% KOH etchant to remove the regions of lesser thickness, leaving a foil matrix with patterned apertures. Higher KOH temperature can result in foil etching too fast in certain areas and creating "hot spots" due to high concentrations or pools of silicon in those areas After the apertures are etched into the foil and the silicon spheres are doped, the next step is to prepare a cell package. The first step in loading the spheres is to cup the front foil. This technique was found very helpful in preventing the outermost spheres from moving before the bond is made. An 8 mils thick aluminum foil, though other thicknesses work as well, with a square cutout in its center is placed on the cell's frontside. The cutout is just larger than the length and width of the cell pattern. The "cupping mask" is carefully placed around the periphery of the embossed area. By applying a downward force to the 8 mil foil, the front foil near the edge of the opening is pushed downward forming a ridge or cup all the way around the embossed area.

The spheres are loaded onto the front foil by means of a vacuum chuck. The vacuum chuck used a porous plastic material such as that from Porex Technologies, Fairburn, Ga., as the diffuser rather than a metal screen. The porous plastic provides a much more uniform vacuum and eliminates the blockage of foil holes by the web of the metal screen. The vacuum chuck containing the front foil is held over a collection box while the spheres are poured onto the foil until the embossed areas is completely covered. The vacuum exerts enough downward force to attract and hold the spheres in the holes. Any excess spheres such as those on a second or third layer and around the periphery can be jarred loose by tilting and agitating the vacuum chuck. The loose spheres fall into the collection box for use on subsequent cells.

After the sphere loading is complete, the foil is then transferred to a loading station. The loading station, depicted in FIG. 5 is a 3-ton Arbor press (Dake Model #001). The two platens 120 and 122 are made of aluminum with silicone rubber glued to their exposed surfaces at 124 and 126. The top platen 120 is 2.5"×2.5"×0.5" thick with 0.125" thick rubber. The bottom platen 122 is slightly larger at 2.5"×2.5"×0.5" with 0.125" thick rubber. Both platens were machined to provide a vacuum cavity (not shown). Referring to FIG. 7A, before the foil with the loose spheres is transferred to the loading station, two 3"×3"×0.008" thick coated aluminum foils 128 and 130 are positioned on the bottom platen 122 in a diamond shape (turned 90° off axis) such that their corners are extended over the four edges of the platen as shown in 7(A).

Figure 9:
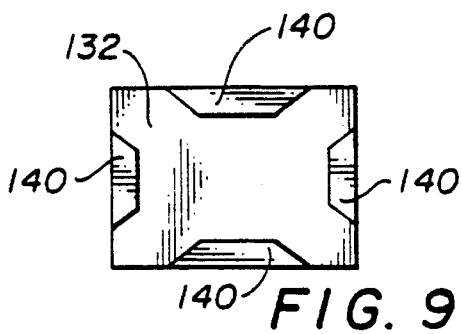
FIG. 9 is a completed cell package for use with the present invention.

Referring to FIG. 7(b), a second 3"×3"×0.008" thick coated aluminum foil 132 is then placed on top of the two bottom foils indicated by single reference number 134. The edges of the top foil are parallel to those of the platens of the press. The coated sides of the foils face each other. The top plate is lowered and the vacuum is applied to the platens. The corners of the bottom coated foils are squared or cut as shown in FIG. 7C making it easier to fold the tabs over the top coated foil as shown in FIG. 9. Once the tabs are cut, the top platen is raised taking with it the topside coated foil 132. FIG. 8 shows the 8 mil thick coated aluminum foils 132 and 130, which are called release pads or pressure pads, positioned in the loading station.

The front foil 136 is removed from the vacuum chuck and placed between the two coated foils 132 and 130 as is shown in FIG. 8. The top plate 120 is lowered until contact is made with the cell 138 and the tabs 140 folded up and over the topside foil 132 to form one cell package (FIG. 9). The pressure from the press is maintained on the cell package 138 until the tabs 140 are folded. The vacuum on the plates is then released and the top platen 120 withdrawn. The rubber 124 on the top platen 120 deforms the 8 mil coated Al foil around the spheres which along with the cupping of the front foil prevents the spheres on the outermost rows from moving.

The foil with the spheres positioned on the backside of foil 2 in FIG. 1(a) is removed from the vacuum chuck and placed between pressure pads such as a multiple layer 8 mil thick coated aluminum foil package shown in FIG. 6 by folding the two package ends on top of the cells. The cell package is then placed on the bottom platten of a precision press. The bottom platten is slowly raised until the top platen is contacted. The two plattens are left in contact with the solar cell sandwiched in between for a period of time not exceeding 1.5 minutes. After the elapse of 1.5 minutes, the platens are then separated and the cell is removed. Both the top and bottom platens are maintained at a temperature of 500° C. The aluminum of foil 2 reacts with the very thin native silicon oxide layer on spheres 8 and removes it so that the aluminum in the foil 2 is now able to bond directly to the elemental silicon in the N-type layer 10 of sphere 8 to form a contact thereto.

The completed cell package, shown in FIG. 9, facilitates the transporting of the cell without movement of spheres from the loading station to the front bonding press.

Referring now to FIG. 6, the front bond cell sandwich 150 is constructed as follows. A cell package 152 comprises an 8 mil thick raw 1145 aluminum foil 154 and a second 8 mil thick 1145 aluminum foil 156 having a release coat 158. Release coat 158 and the various release coats hereinafter discussed are constructed by mixing 20 ml printers' ink, 20 ml ethylene-glycol, 6.0 gms of boron nitride and 6.0 gms of silica; additional ethylene-glycol can be mixed in to the foregoing to achieve a desired consistency. Next to release coat 158 is foil matrix 160 with spheres 161 resting thereon. Mounted on top of spheres 161 is 1 mil thick 1145 aluminum foil 162 with release coat 164 facing the top of sphere 161. Foil 166, also an 8 mil 1145 aluminum, with a release coat 167 completes all package 152.

Cell package 152 is pressed between upper pressure pad 168 and lower pressure pad 170. Upper pressure pad 168 is comprised of foil 172, an 8 mil thick 5052 aluminum foil, with a release coat 174 facing cell package 152. A layer 176 of compressed graphite, such as Grafoil® from Union Carbide, completes upper pressure pads 168. Lower pressure pad 170 is comprised solely of compressed graphite layer 178 which can be the same as layer 176.

Foil 162 of cell package 152 is constructed of aluminum having between 0.5% and 1.5% but preferably 1.0% silicon by weight. As the various layers are compressed spheres 161 are forced into apertures 163 as has previously been explained.

Figure 10A:
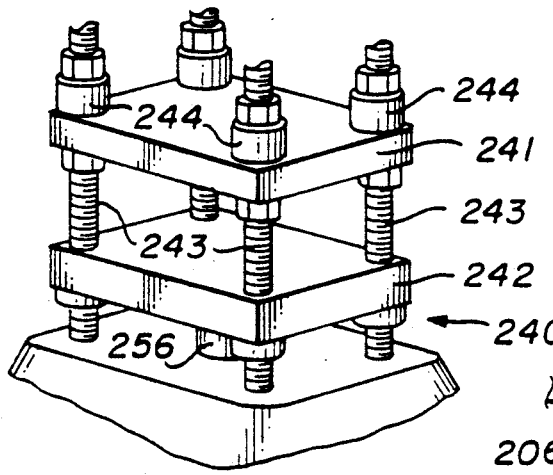
FIG. 10A shows a hydraulic press for binding silicon spheres to aluminum foil and for affixing aluminum pads to the silicon spheres in accordance with the present invention.
Figure 10B:
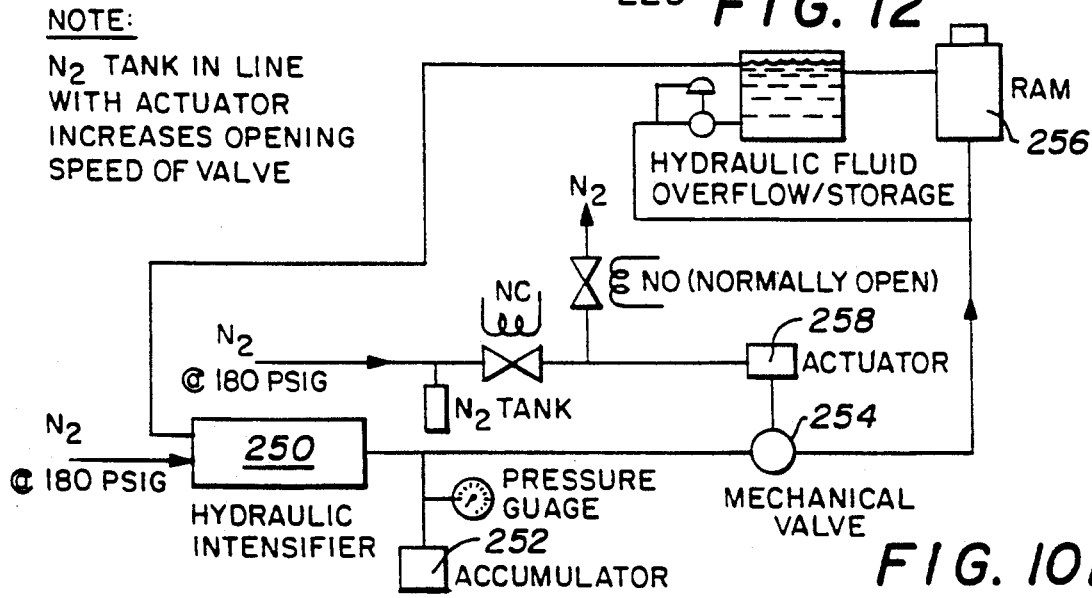
FIG. 10B is a diagram of the hydraulic press in FIG. 10A modified for use with the invention.

A bonding press 240, FIG. 10(A), is shown schematically in FIG. 10(B). Press 240, is a four-poster made by Carver of Menomonee Falls, Wis., Model No. 2629-X and has the capability of delivering 30 tons force at 600° C. However, for bonding silicon spheres to aluminum foil, the press has to be modified to deliver fairly large forces (12.5–15 tons) during a very short time span (0.10 sec.) and over small displacements (0.050–0.100 inch). To accomplish this end, a hydraulic intensifier 250, accumulator 252, and pneumatically actuated mechanical valve 254 were added to the press. FIG. 10B shows a piping schematic of the modified press. items are standard off-the-shelf items available from most hydraulic component manufacturers as is well known to those skilled in the art.

The hydraulic intensifier 250 is from Haskell of Burbank, Calif. The air driven fluid pump, Model AW-35, delivers maximum liquid pressure of 5700 psig at an air pressure of 150 psig. The accumulator 252 is from United Technologies Diesel Systems of Springfield, Mass. Model ACH-5A-08-P-NT, having capacity of 5.0 in³, with a working pressure of 5000 psig. Mechanical valve 254 is Model 20395N (pneumatic with spring return) from Worcester Controls of West Boylston, Mass.

Mechanical valve 254, Model IH446YTSE, 1.0" having a 0.81" port with maximum pressure of 4500 psig, was selected over various solenoid combinations. The reason is that in order to charge up accumulator 252 without disturbing press ram 256, a leak-tight valve was necessary which the solenoid valves could not provide. The mechanical valve 254 was also oversized to ensure that sufficient fluid flow began as soon as the valve 254 was only partially open.

It is important that the platens 241 and 242 (FIG. 10A) be aligned parallel to each other. This is accomplished by adjusting the top platen 241 which in the Carver press moves up and down on four threaded rods 243 and is held in check by nuts 244. The bottom platen 242 travels along the threaded rods 243 as well but is not adjustable. The parallelism of the platens 241 and 242 is checked at room temperature by measuring the change in thickness of 0.080" diameter solder shaped into a 1.50" square. The solder square was placed inside a hinged plate and then pressed using the standard front bond cycle. Any significant (0.001") deviation of the four sides relative to each other was compensated for by lowering or raising that particular side of the top platen 241.

Another more practical method of aligning the press platens was to bond a back foil to a cell and observe the following: (1) the impressions made on the frontside pressure pads and (2) the size and uniformity of the aluminum pad. For example, if the spheres penetrate the pressure pads deeper on one side, obviously this side of the top platen 241 needs raising relative to the others. Likewise, an aluminum pad with larger surface areas in one particular region of the cell indicates excessive pressure being applied there. The advantageous feature of this alignment method is its in situ approach. The alignment is measured under actual test conditions and on a cell, not a piece of solder at room temperature. The disadvantage is that it is a destructive test because the cell used for the test cannot or should not be used again except for future alignment checks.

The standard cycle of press 240 for a 10 cm$^2$ bond is as follows. The cell package 152 (FIG. 6) and sandwich 150 were placed in a preheated hinged plate 151 which consists of two pieces of a hardened material such as tungsten carbide or hardened steel ($R_c$=62) 4"×4"×0.5" thick, joined at the back by a hinge. Hinged plate 151 is open at the front. The four faces of the plates 151 were Blanchard ground flat to within ±0.0001" and parallel to ensure uniform pressure across the cell.

If the hinged plate is not used the cell package parts will tend to bow or warp at the edges due to the thermal expansion differences when placed on the platens to preheat. This movement of the Al pressure pads will cause the spheres to move out of their holes in the front foil resulting in misplaced spheres and empty holes after bonding. The hinged plate resolves the expansion problem.

Cell sandwich 150, set between hinged plates 151 is pushed forward until it is centered over the ram 256. The bottom platen 242 is then slowly raised until hinged plate 151 makes contact with the top platen at a force of between 0.5 and 1.5 tons.

After a preheat dwell period of between 0.5 to 2.0 minutes, accumulator 252 is charged to 6000 psig with hydraulic intensifier 250. This charging- sequence requires about 15 seconds. Previous to this charging, mechanical valve 254 is closed isolating ram 256 from the accumulator.

As soon as accumulator 252 is fully charged, an electrical switch (not shown) is activated which opens the inlet solenoid valve (not shown) to actuator 258 opening mechanical valve 254. As soon as valve 254 starts to open, accumulator 252 instantaneously tries to discharge moving ram 256 in the range between 0.5 and 1.5 tons preheat force to the final bonding force of between 12.5 and 15.0 tons or between 5.0 lbs. and 6.0 lbs. per sphere in less than 0.1 second. After between 1.0 and 60.0 seconds, the platens 241 and 242 are released and the cell package is removed.

After the front bonding process described with respect to FIGS. 6 and 10 is complete and the spheres have been bonded to the foil, the rear surface of the foil and that portion of the sphere on the backside is then etched, as is well known to those skilled in the art, to remove the portion of the N-type layer on the backsurface of the array and expose the P-type region. After the N-type layer has been removed it is necessary to test the solar array to identify and isolate those cells having a low resistance path across the P-N junction. The process for shunting the low resistance cells comprises a first step of applying a polyimide coating to the backside of the foil and the P-type region of the solar sphere.

Figure 13:
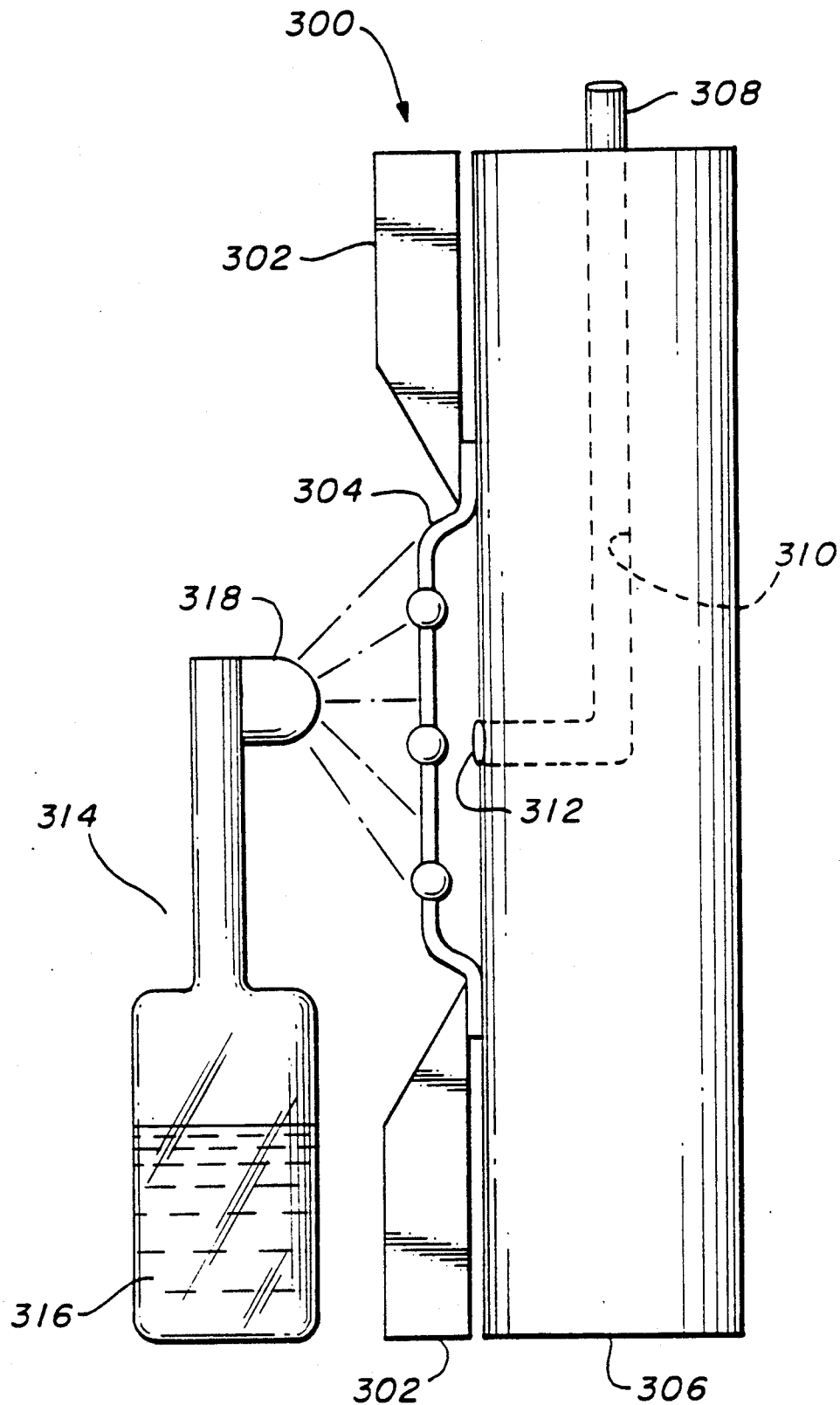
FIG. 13 is an applicator for applying an organic insulator to a solar array in accordance with the present invention.

Referring to FIG. 13, an apparatus for applying an organic insulating material, such as polyimide, is depicted. Fixture 300 has jaws 302 for holding solar array 304 in a sealing arrangement to base 306. Base 306 is plumbed for applying pressurized gas in the range between 1 and 5 PSI, such as compressed air or nitrogen, to the light-gathering side 305 of solar array 304. A gas supply (not shown) would be connected to inlet port 308 and conveyed along tube 310 to outlet port 312.

Still referring to FIG. 13, sprayer 314 is a conventional atomizer containing a liquid polyimide 316. The atomized polyimide is applied to solar array 304 through spray nozzles 318. The pressure built up between base 306 and array 304 prevents the organic insulating material from leaking through holes in array 304 onto the light-gathering side 305. This results in a solar array with a uniform dielectric coating on the backside, and no coating on the light-gathering side.

After the polyimide coating has been applied, covering the entire back surface of the foil and the solar cells, a small amount of the polyimide is removed from each solar cell by mechanical abrading. Only a small amount of the polyimide is removed at the tip of the solar cell leaving sufficient area for subsequent attachment of the aluminum pads. After the mechanical abrading is completed the polyimide is cured, using known techniques, to provide a hard insulating coating everywhere on the surface except where the sphere has been abraded.

Figure 11:
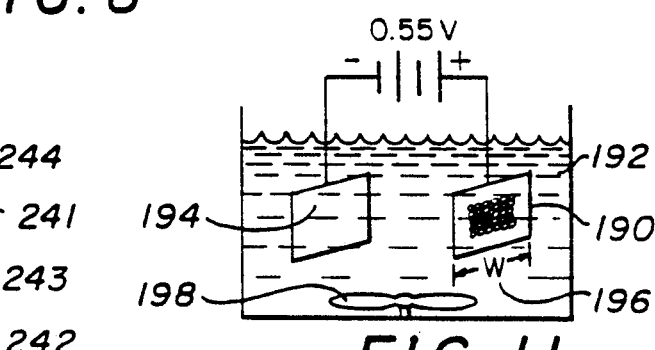
FIG. 11 is a schematic diagram of a process in accord with the present invention for selective electro-dissolution of shorted silicon spheres in a solar array.

Referring now to FIG. 11, the solar array 190 is immersed in an acid bath 192. Bath 192 consists of hydrofluoric acid (HF) and $H_2O$ in a mixture of at least 45% HF. It has been found that at least 52% HF is optimal. Plate 194 is maintained parallel to array 190 and can either be a solid plate or screen. Plate 194 should be at least of approximately the same area as cell 190 and preferably larger. The distance between plate 194 and array 190 should be approximately equal to the width 196 of array 190. The potential difference across plate 194 and array 190 should be approximately in the range of 0.20 to 1.00 volts and preferably 0.55 volts.

The anodic process depicted in FIG. 11, if conducted at 0.55 volts, should be maintained for between seconds and 5.0 minutes, preferably 30 seconds. At lower voltages the anodic process should be conducted for longer periods of time. It has been found, however, that shorter times are preferable.

While the process has been conducted at room temperature, it has been discovered that lowering the temperature of bath 192 is preferred. One technique (not shown) is to immerse acid bath 192 in a chilled water bath to just above 0° C. Other techniques, commonly known to those skilled in the art, would work as well. Agitator 198 is provided to more completely mix the HF/H₂O solution of acid bath 192. It should also be noted that lower HF concentrations of acid bath 192 requires a higher voltage across plate 194 and array 190.

The anodic process depicted in FIG. 11 results in a silicon oxide coating being deposited on those solar cells that have a short between the P-N junction. This effectively removes the cell from the array circuit and avoids a resulting power drain. After the shorted cells have been isolated the solar array is ready for receiving the aluminum pads.

The same hydraulic press used for making the front bond is also used for the aluminum pad installation. A cell package is constructed and inserted between a pair of hinged plates and pressure applied to perform the junction between the aluminum pad and the P-type region of the solar sphere.

Figure 12:
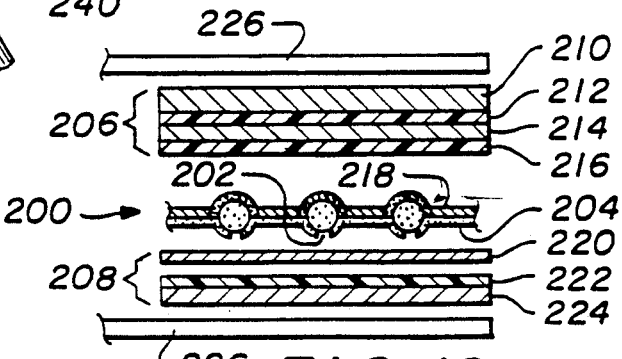
FIG. 12 illustrates the package layers used in affixing the aluminum pads in accordance with the present invention.

Referring now to FIG. 12, there is shown a cell sandwich 199 for use in installing the aluminum pads. Array 200 with voids 202 abraded into the surface of polyimide coating 204 is sandwiched between upper layer 206 and a bottom layer 208. Upper layer 206 has thick aluminum foil 210 which is about 8 mils thick and has release coating 212. Against release coating 212 is a thinner aluminum foil member 214 having release coating 216. Release coating 216 faces front side 218 of array 200 In an alternative embodiment (not shown) a layer of compressed graphite can be added to upper layer 206.

Still referring to FIG. 12, a pressure pad such as bottom layer 208 comprises thin foil member 220, having between 0.5% and 1.5% but preferably 1.0% silicon by weight, approximately 0.25 mils thick aluminum foil. Beneath foil member 220 is plate 222 which is a 2 mil thick stainless steel plate having release coating 224. Cell sandwich 199 is set between a pair of hinged plates 226 and pressed to a snug force of 3000 lbfs., or between 0.4 lbs. and 0.6 lbs. per sphere, using a hydraulic press such as that described with respect to FIG. 10. The entire cell sandwich 199 fixed between hinged plates 226 is preheated at the pressure 3000 lbs. and a temperature in the range between 300° C. and 400° C. preferably closer to 350° C. for a period of time in the range between 0.5 and 2.0 minutes, preferably 1.5 minutes, to allow the cell and foil member 220 to reach a steady-state temperature. At the 1.25 minute stage of the preheat cycle, mechanical valve 254 (FIG. 10B) is closed and accumulator 252 (FIG. 10B) is charged to a pressure of 2000 psi. At the 1.5 minute mark, mechanical valve 254 is opened instantaneously to a platen force of between 8000 and 9000 lbs. or between 1.25 lbs and 2.00 lbs. per sphere. Cell sandwich 199 is left at this force for a dwell period in the range between 0.25 and 2.00 minutes, preferably 1.00 minute, and at the end of that time, pressure is released, and the cell is removed for cooling. After cooling, the excess of foil 220 is removed producing a solar cell such as that shown in FIG. 1(f) ready for the back bonding and testing steps as has previously been described.

Though the invention has been described with respect to a specific preferred embodiment thereof, many variations and modifications will become apparent to those skilled in the art. It is therefore the intention that the appended claims be interpreted as broadly as possible in view of the prior art to include all such variations and modifications.

What is claimed is:

1. In a method for making an array of solar cells, the method for affixing a metal pad to each of a plurality of silicon spheres mounted in a conductive foil matrix, comprising the steps of:

forming a cell sandwich between an upper pad and a plate, said cell sandwich including said conductive foil matrix with said silicon spheres mounted therein, a metal foil, and an insulating layer between said conductive foil matrix with said spheres and said metal foil;

defining a plurality of apertures in said insulating layer to expose a portion of said spheres;

compressing said cell sandwich to a first pressure;

heating said pressurized cell sandwich to a predetermined temperature;

compressing said heated cell sandwich to a second pressure greater than said first pressure for a period of time sufficient to fuse said metal foil to said exposed portion of said silicon spheres; and removing excess of said metal foil leaving a metal pad affixed to said exposed portion of said silicon spheres.

2. The method of claim 1 wherein said silicon spheres have a P-type region.

3. The method of claim 2 wherein said metal pads are fused to said P-type region.

4. The method of claim 1 wherein said metal foil is constructed of aluminum containing silicon in the range between 0.5% and 1.5% by weight.

5. The method of claim 1 wherein said upper pad and said plate are coated with a release agent.

6. The method of claim 5 wherein said release agent comprises printer's ink, boron nitride, ethylene-glycol, and silica.

7. The method of claim 1 wherein said plate is stainless steel.

8. The method of claim 1 wherein said upper pad comprises two layers of aluminum foil coated with a release agent.

9. The method of claim 8 wherein one of said aluminum foil layers is substantially thicker than the other of said aluminum foil layers.

10. The method of claim 8 wherein said upper pad further comprises a layer of compressed graphite.

11. The method of claim 1 wherein said first pressure is in the range between 0.4 and 0.6 lbs. per sphere.

12. The method of claim 11 wherein said second pressure is in the range between 1.25 lbs. and 2.00 lbs. per sphere.

13. The method of claim 12 wherein said heated cell sandwich is held at said second pressure for a period of time in the range between 0.25 and 2.00 minutes.

14. The method of claim 11 wherein said cell sandwich is held at said first pressure for a period of time in the range between 0.5 and 2.0 minutes.

15. The method of claim 1 wherein said predetermined temperature is in the range between 300° C. and 400° C.

16. The method of claim 1 further comprising the step of cooling said cell sandwich prior to removing said excess foil.

* * * * *